United States Patent
Ghosh et al.

(10) Patent No.: US 10,976,360 B2
(45) Date of Patent: *Apr. 13, 2021

(54) AGING-SENSITIVE RECYCLING SENSORS FOR CHIP AUTHENTICATION

(71) Applicant: University of South Florida, Tampa, FL (US)

(72) Inventors: Swaroop Ghosh, Tampa, FL (US); Cheng-Wei Lin, Seffner, FL (US)

(73) Assignee: University of South Florida, Tampa, FL (US)

( * ) Notice: Subject to any disclaimer, the term of this patent is extended or adjusted under 35 U.S.C. 154(b) by 17 days.

This patent is subject to a terminal disclaimer.

(21) Appl. No.: 16/135,445

(22) Filed: Sep. 19, 2018

(65) Prior Publication Data
US 2019/0018058 A1 Jan. 17, 2019

Related U.S. Application Data

(63) Continuation of application No. 16/014,195, filed on Jun. 21, 2018, now Pat. No. 10,302,692, which is a (Continued)

(51) Int. Cl.
G01R 31/28 (2006.01)
G01R 31/30 (2006.01)
G01R 23/02 (2006.01)

(52) U.S. Cl.
CPC ......... *G01R 31/2832* (2013.01); *G01R 23/02* (2013.01); *G01R 31/282* (2013.01); *G01R 31/3016* (2013.01); *G01R 31/2882* (2013.01)

(58) Field of Classification Search
CPC ..................................................... G01R 31/28
See application file for complete search history.

(56) References Cited

U.S. PATENT DOCUMENTS 5,886,556 A 3/1999 Ganger
6,252,452 B1 6/2001 Hatori
(Continued)

FOREIGN PATENT DOCUMENTS

WO 2014124023 8/2014

OTHER PUBLICATIONS

Huang, K., Carulli, J. and Makris, Y. (2013). "Counterfeit electronics: A rising threat in the semiconductor manufacturing industry." pp. 1-4, Proceedings of the IEEE, vol. 102, No. 8.
(Continued)

*Primary Examiner* — Charlie Y Peng
(74) *Attorney, Agent, or Firm* — Thomas|Horstemeyer, LLP

(57) ABSTRACT

Various devices, methods and systems are provided for aging-sensitive chip authentication. In one example, among others, a chip includes a reference Schmitt trigger ring oscillator (STRO) configured to enter a sleep mode during operation of the chip; a stressed STRO; a VDD charge pump configured to boost a positive voltage supplied to the stressed STRO during operation of the chip; and/or a GND charge pump configured to under-drive a ground voltage supplied to the stressed STRO during operation of the chip. In another example, a method includes detecting activation of a chip including a reference STRO and a stressed STRO and, in response to the activation of the chip, initiating sleep mode operation of the reference STRO. In response to the activation of the chip, a VDD voltage supplied to the stressed STRO can be boosted and/or a GND voltage supplied to the stressed STRO can be under-driven.

17 Claims, 7 Drawing Sheets

Shaded chips are flagged recycled

Recycling of shaded chips are masked

Related U.S. Application Data continuation of application No. 14/966,224, filed on Dec. 11, 2015, now Pat. No. 10,036,773.

(60) Provisional application No. 62/090,527, filed on Dec. 11, 2014.

(56) References Cited

U.S. PATENT DOCUMENTS

| | | | |
|---|---|---|---|
| 9,255,967 | B2 | 2/2016 | Ahmadi et al. |
| 2006/0223201 | A1 | 10/2006 | Liu et al. |
| 2013/0019324 | A1 | 1/2013 | Tehranipoor et al. |
| 2014/0103344 | A1 | 4/2014 | Tehranipoor et al. |
| 2014/0197895 | A1 | 4/2014 | Reddy |

OTHER PUBLICATIONS

Manikandan, S. "Low Power Design of Sensors for Detection of Recycled ICs." Proceedings of the International Journal of Advanced Engineering and Global Technology, Apr. 2014.

Zhang, Xuehui, "On-chip Structures and Techniques to Improve the Security, Trustworthiness and Reliability of Integrated Circuits" (2013). Doctoral Dissertations. Paper 31. University of Connecticut Graduate School.

X. Zhang, N. Tuzzio, and M. Tehranipoor, "Identification of Recovered ICs using Fingerprints from a Light-Weight On-Chip Sensor," Proceedings of the 49th Annual Design Automation Conference (DAC), pp. 703-708, Jun. 2012.

Guin, Ujjwal et.al "Low-cost On-Chip Structures for Combating Die and IC Recycling." Proceedings of 51st Annual Design Automation Conference (DAC), Jun. 2014.

Somasekhar, Dinesh et.al "Multi-phase 1 GHz voltage doubler charge pump in 32 nm logic process." IEEE Journal of Solid-State Circuits, Apr. 2010.

J. Keane, X. Wang, D. Persaud, and C. H. Kim, "An all-in-one silicon odometer for separately monitoring HCI, BTI, and TDDB," IEEE J. Solid-State Circuits, vol. 45, No. 4, pp. 817-829, Apr. 2010.

M. Rostami, F. Koushanfar, J. Rajendran, and R. Karri. "Hardware security: Threat models and metrics." Proceedings of the IEEE/ACM International Conference on Computer-Aided Design (ICCAD), pp. 819-823. IEEE Press, Nov. 2013.

Y. Wang, S. Cotofana, and L. Fang, "A unified aging model of NBTI and HCI degradation towards lifetime reliability management for nanoscale MOSFET circuits," in Proc. IEEE Int. Symp. Nanoscale Archit., Jun. 2011, pp. 175-180.

Zheng, Yu et.al "CACI: Dynamic Current Analysis Towards Robust Recycled Chip Identification." Proceedings of 51st Annual Design Automation Conference (DAC), Jun. 2014.

Tudor, J. Wang, C. Sun, Z. Chen, Z. Liao, R. Tan, W. Liu, and F. Lee. "Mosra: An efficient and versatile MOS aging modeling and reliability analysis solution for 45nm and below." 2010 10th IEEE International Conference on Solid-State and Integrated Circuit Technology (ICSICT), pp. 1645-1647. IEEE, Nov. 2010.

AGING-SENSITIVE RECYCLING SENSORS FOR CHIP AUTHENTICATION

CROSS REFERENCE TO RELATED APPLICATIONS

This application is a continuation of and claims priority to co-pending application Ser. No. 16/014,195, filed on Jun. 21, 2018 entitled "Aging-Sensitive Recycling Sensors for chip Authentication", which is a continuation of and claims priority to application Ser. No. 14/966,224, filed on Dec. 11, 2015 entitled "Aging-Sensitive Recycling Sensors for chip Authentication", which claims priority to, and the benefit of, U.S. provisional application entitled "Aging-Sensitive Recycling Sensors for Chip Authentication" having Ser. No. 62/090,527, filed Dec. 11, 2014, all of which are hereby incorporated by reference in their entireties.

STATEMENT REGARDING FEDERALLY SPONSORED RESEARCH OR DEVELOPMENT

This invention was made with government support under agreement 1441757 awarded by the National Science Foundation. The Government has certain rights to the invention.

BACKGROUND

Recycling of integrated chips has become a major concern with increasing numbers of recycled chips entering the supply chain. Chip recycling involves scavenging and reusing the aged but functionally correct integrated circuits (ICs) in new systems. Although the devices using recycled chips might operate correctly, the operating speed and energy-efficiency will be degraded due to the prior usage. Conventional techniques exploit the temporal degradation of circuit performance to isolate the recycled ICs. Isolating recycled ICs from the genuine ones is a challenging task for arbitrarily small amounts of usage (e.g., from a few seconds to a few months). In general, conventional techniques are ineffective in detecting such fine grained usage intervals.

BRIEF DESCRIPTION OF THE DRAWINGS

For a more complete understanding of the embodiments described herein and the advantages thereof, reference is now made to the following description, in conjunction with the accompanying figures briefly described as follows.

Figure 1A:
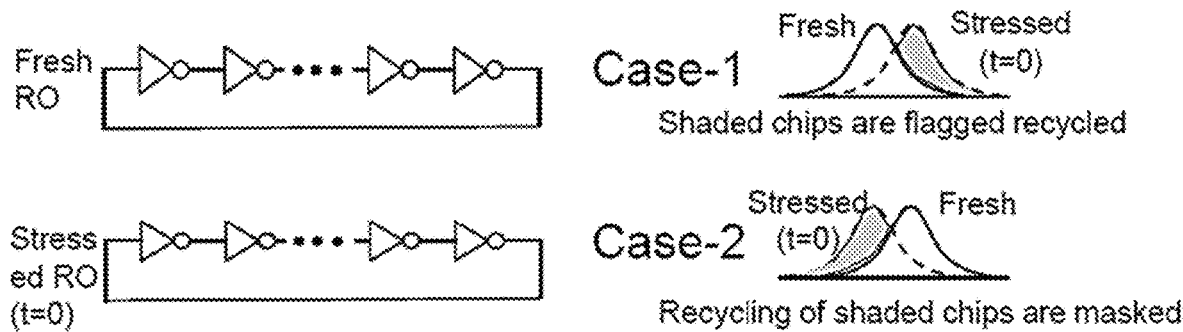
FIGS. 1A through 1C illustrates an example of distribution of delay difference between fresh and stressed ring oscillators (ROs) in accordance with various embodiments of the present disclosure.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

Disclosed herein are various embodiments related to aging-sensitive recycling sensors for chip authentication. A Schmitt-Trigger (ST) based recycling sensor combined with self-calibration to mitigate process-variation induced sensing errors and to amplify the aging induced delay degradation is discussed. Voltage boosting can be used to enhance the aging mechanisms. The ST based recycling sensor can detect fine grained recycling (e.g., a 0.1 second usage with negligible error). Reference will now be made in detail to the description of the embodiments as illustrated in the drawings, wherein like reference numbers indicate like parts throughout the several views.

Detection of recycled ICs can improve the security and trustworthiness of the integrated systems. Recycled ICs can impact the operational performance and efficiency of the device they are used in, as well as be tampered to leak secret keys to an adversary. The performance degradation of used ICs from the brand new ones can be employed to identify the recycled ICs. These sensing techniques can utilize aging mechanisms such as bias temperature instability and hot-carrier injection to degrade a ring oscillator based sensor circuit.

Combating die recovery (CDR) sensors include two ring oscillators (ROs) comprising a series of connected inverters: a reference RO and a stressed RO. Recycled ICs with CDR can be identified by measuring the frequency degradation of the stressed RO with respect to the reference RO. The reference and the stressed ROs are physically placed close to each other to minimize the spatial (i.e., process and environmental) variations. The estimated usage time can be measured based on the frequency difference. The larger the frequency difference, the longer the period of prior use. However, the sensitivity of the CDR largely depends on the degradation rate of the stressed RO. Although effective, the CDR methodology is generally limited to identifying chips that are used for at least a few months. Therefore, usage of a few hours or a few months can go undetected.

A negative bias temperature instability (NBTI)-Aware RO-CDIR sensor may be used to enhance the effectiveness of the conventional RO-based sensor by continuously applying NBTI-stress to all inverters within the RO. This design consumes virtually no power during normal operation and is able to effectively isolate 3 days of usage under low process variation. For larger process variations, the methodology can result in a large error. The dynamic current analysis based technique used to identify recycled chips revolves around the idea that different portions of functional unit will experience a different degree of stress due to widely varying level of activities. For instance, in a 32-bit full adder, the lower 16-bits experience a significantly larger amount of switching activity than the higher 16-bits. This leads to different levels of aging within the functional unit. To isolate the used IC, the average dynamic current of the high activity functional block can be compared with the reference dynamic current of low activity functional block. The advantage of this technique is virtually zero area and power overhead. Simulation results show a high predication rate for a usage level of years. However, it is unable to detect arbitrarily small amount of usage.

Anti-Fuse (AF) based sensors include two components: a counter and an AF ROM (read only memory) block. As the AF ROM block is one-time programmable (OTP), its contents cannot be erased during recycling. A device with AF programs an additional AF cell for each additional unit of time that the device is utilized, which is determined by the counter. The actual usage period of the chip can then be determined based on the number of cells that have been flipped. The advantage of the AF-based design is that it can detect usage for even a single unit time. However, the accuracy and detection intervals are restricted by the size of the AF ROM. In addition, this method utilizes a counter and programming unit, which can be area and power intensive.

Traditionally, precautions are taken during circuit design to suppress the aging effects such as negative bias temperature instability (NBTI), positive bias temperature instability (PBTI) and hot carrier injection (HCI). However, these aging mechanisms can be exploited to make the recycling sensors extremely sensitive to usage at very small intervals. The effect of aging can be amplified through a combination of RO circuit design (e.g., using Schmitt Triggers (STs) to increase sensitivity) and control of the supply voltages (e.g., voltage boost or under-drive) for chip authentication. Analysis indicates that these STRO recycling sensors can be used to reliably detect a recycled IC with only a few hours of operation.

Figure 1B:
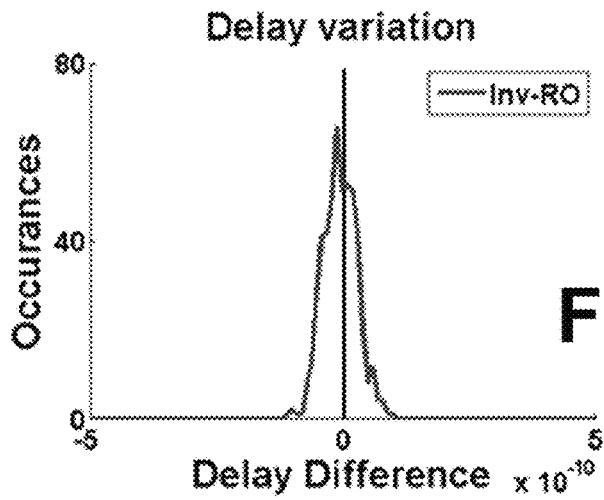

One of the challenges in recycling detection is the process variation between the aged (or stressed) and fresh ROs at t=0. This is illustrated in FIG. 1A, where two possible conditions are shown. In the first case (Case-1), the chip can be falsely identified as "recycled" because the stressed RO is slower than fresh RO. In the second case (Case-2), fine grained recycling of the chip can be masked because the stressed RO is faster than fresh RO. Isolating the recycled ICs from the genuine ones for arbitrarily small amounts of usage (e.g., a few seconds to minutes) is a challenging task. FIG. 1B shows simulation results illustrating an example of the distribution of delay difference between fresh and stressed RO at t=0 under process variations. It is evident that the chips on the left will be falsely pronounced as recycled and chips on right will mask fine grained recycling. FIG. 10 illustrates an example of the shift (or movement) of the distribution after different amounts of stress periods (e.g., no aging (na), 1 second of aging (1 s), 10 seconds of aging (10 s), 15 minutes of aging (15 m) and 1 day of aging (1 d)). It can be seen that as much as 1 day of recycling may be hidden due to process variations.

Recycling sensors that are tailored to amplify the aging mechanisms, allowing for the detection of hours to days of use, will now be discussed. The recycling sensor designs can leverage three types of transistor aging mechanisms for chip authentication. For example, the RO degradation can be accelerated through excessive stressing. The impact of NBTI in PMOS and PBTI in NMOS can be enhanced by boosting the voltage seen by the VDD rail and under-driving the voltage supplied to the GND rail using light-weight charge pumps. The impact of HCI can also be enhanced by increasing the slew rate of the output when the input is making a transition. This can be achieved by replacing the inverters in the RO with Schmitt triggers (STs). The STs can be appropriately sized to increase the decay effect (e.g., twice that of a standard component). Extensive stressing can create a large frequency difference between the two ROs, which allows a clear distinction to be determined even over smaller usage intervals.

Figure 2:
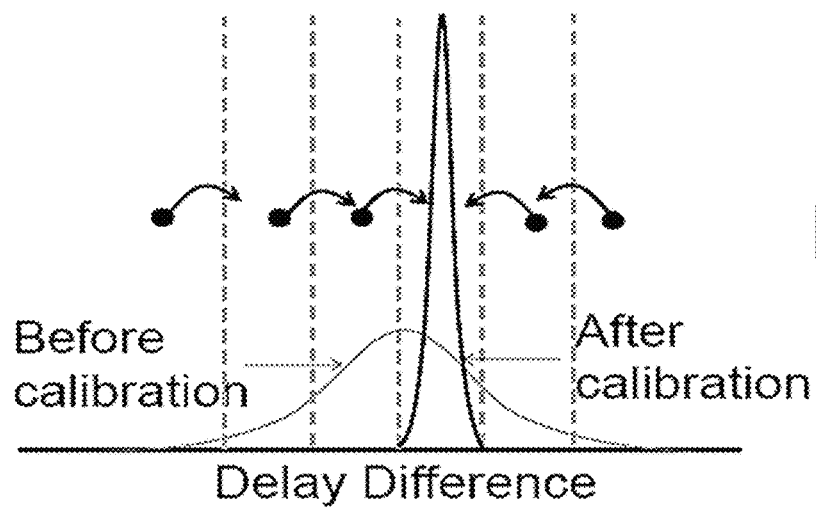
FIG. 2 illustrates an example of self-calibration effects of a recycling sensor in accordance with various embodiments of the present disclosure.

Various combinations of techniques can be used to address the above mentioned challenges. First, a self-calibration of the recycling sensor can be used to nullify the effect of process variations. Both ROs can contain embedded programmable load capacitors that can be enabled. The faster RO can be selected as the "stressed" RO and slowed down through addition of the extra programmable loads. Since the delay difference is calculated as the flesh RO delay minus the stressed RO delay, the resulting distribution will always be positive and tighter after calibration. This is conceptually illustrated in FIG. 2. The aim is to slow down the fast RO (among the fresh and stressed ROs) and reduce the spread of delay difference distribution. Multiple levels (e.g., coarse and fine) of granularity can be provided to ensure that large, medium and small delay differences can be mitigated. Next, a Schmitt-Trigger (ST) based ROs (STROs) can be used. The STRO is more susceptible to aging and, therefore, can provide finer recycling detection granularity. Additionally, VDD boost and GND under-drive can be used to accelerate the aging of sensor. It has also been found that high threshold voltage ($V_{th}$) devices can provide better recycling detection compared to nominal $V_{th}$ devices.

Figure 3A:
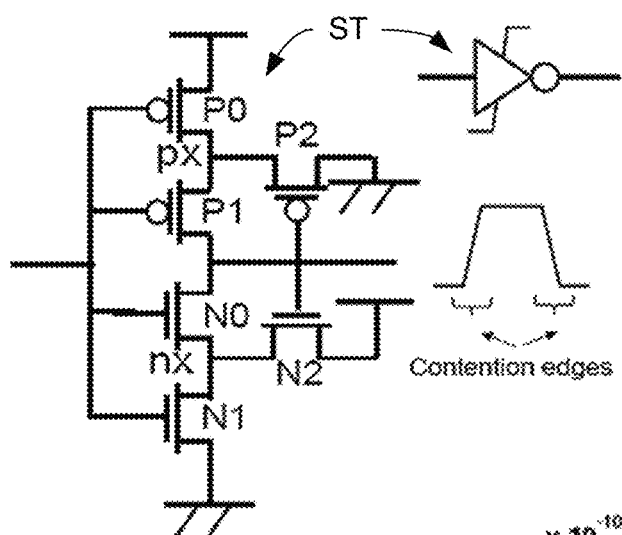
FIGS. 3A and 3B illustrate operation of a Schmitt trigger (ST) in accordance with various embodiments of the present disclosure.

Referring to FIG. 3A, shown is a schematic diagram of an example of a Schmitt-Trigger (ST). STs are widely used to perform robust computations in the presence of noisy inputs such as, e.g., 10 pads. The application of STs for low voltage circuits, such as subthreshold SRAM, has also been proposed. The ST can modulate the switching threshold of the inverter based on the direction of input transitions. In the example of FIG. 3A, P0-P1 and N0-N1 are stacked transistors that form an inverter configuration whereas P2 and N2 are feedback transistors that create contention at the output edges of the ST. When the output is at '1' and input toggles from 0-to-1, feedback transistor N2 prevents node nx from discharging the output effectively, moving the switching threshold of inverter high. Similarly, feedback transistor P2 prevents node px from charging the output during a 1-to-0 input transition, moving the switching threshold of inverter low.

Figure 3B:
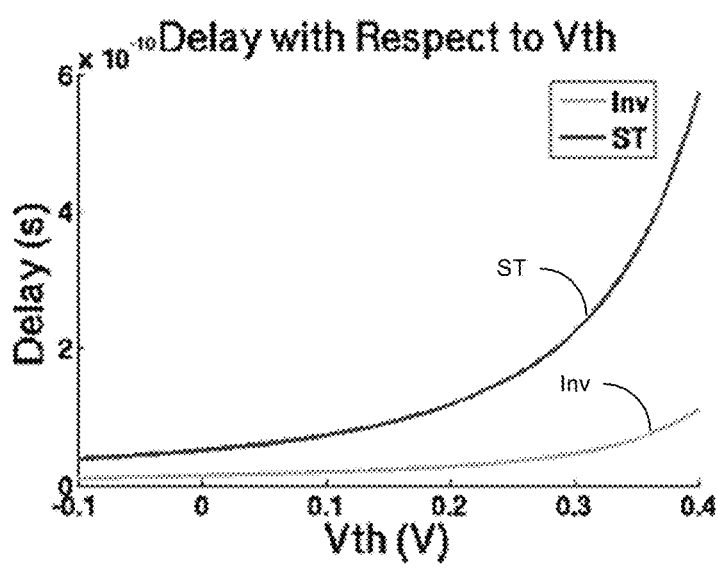

Although the ST is immune to input noise, its delay is sensitive to the strength of feedback transistors P2 and N2 (and stacked transistors P0-P1 and N0-N1). Aging in these transistors is amplified in terms of delay. FIG. 3B illustrates a comparison between inverter and ST delay sensitivity with respect to aging in 22 nm predictive technology model. For this simulation, $\Delta V_{th}$ was added to the $V_{th}$ of all transistors to mimic aging. The value of $\Delta V_{th}$ was swept to observe the sensitivity of the inverter and the ST to different amount of aging. As can be seen from FIG. 3B, the ST was as much as five times more sensitive to the aging induced $V_{th}$ shift than the inverter. Based on the above observation, a ST-based recycling sensor is proposed. Note that the susceptibility of the ST delay on $V_{th}$ shift also makes the ST more sensitive to process variations. However, this effect can be nullified using self-calibration during initialization. This allows the variability of the ST only due to aging to be exploited for recycling sensing.

A Schmitt trigger RO (STRO) based recycling sensor employs STs instead of inverters in the RO to amplify the impact of aging on delay difference distribution. The use of self-calibration can cancel process-variation in STs, and boosting the VDD and under-driving the GND voltages using light-weight charge pumps can accelerate bias temperature instability effects (negative BTI in PMOS and positive BTI in NMOS) in the STs. Employing high-$V_{th}$ devices can further amplify the impact of aging on the delay. These features allow the delay difference spread to be tightened before stress and create a large shift in the delay difference distribution even for fine grained usage intervals, which allows a clear distinction to be detected between new and recycled chips. The impact of hot carrier injection (HCI) is enhanced naturally by the ST due to its larger slew rate of output when the input is making a transition.

Figure 4:
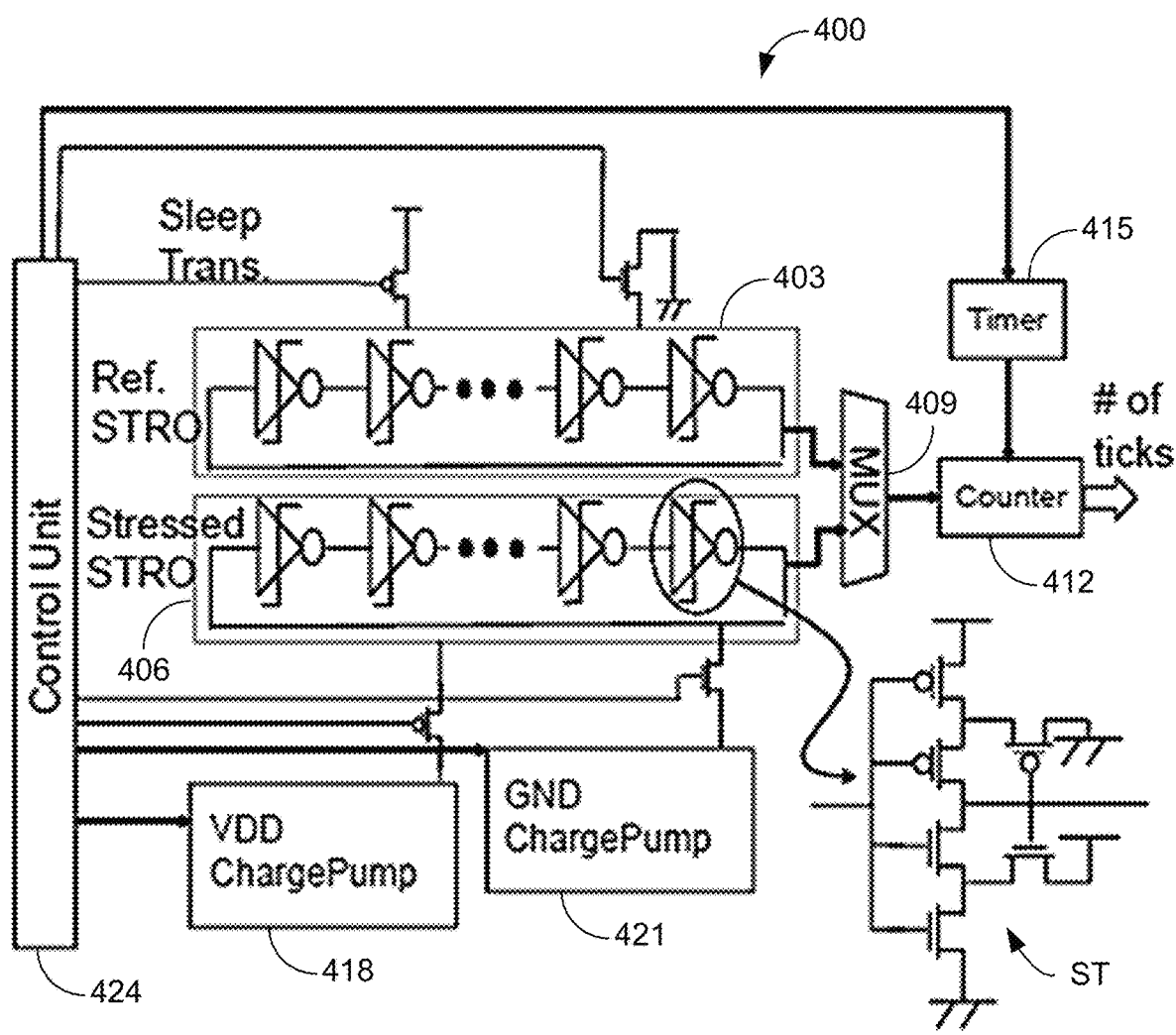
FIG. 4 is a schematic diagram illustrating an example of a Schmitt trigger ring oscillator (STRO) based recycling sensor in accordance with various embodiments of the present disclosure.

Referring to FIG. 4, shown is a schematic diagram of an example of a Schmitt trigger RO (STRO) based recycling sensor 400. The STRO recycling sensor 400 includes a reference STRO 403 and a stressed STRO 406. Each STRO 403/406 includes a ring comprising a plurality of series connected Schmitt triggers (STs). Extra loading capacitors can be added at the internal nodes of the fresh and stress RO through programming. The capacitors on the fast RO can be selected based on the control signals during a calibration phase to equalize the delay of both ROs. A multiplexer 409 allows selection of the output of the reference STRO 403 or the stressed STRO 406 for measurement of the frequency using a counter 412. A timer 415 is used to control the duration of the measurement interval. Nominal VDD and GND voltage levels can be supplied to the reference STRO 403. The voltage levels supplied to the stressed STRO 406 can be controlled by a VDD charge pump 418 and a GND charge pump 421. The VDD charge pump 418 can be used to boost the positive voltage and the GND charge pump 421 can be used to lower (or under-drive) the ground voltage. A control unit 424 can be used to coordinate operation of the various components of the recycling sensor 400.

The reference STRO 403 transitions to a sleep mode during normal operation of the chip to save power and prevent aging of the STRO components. In this way, the reference STRO 403 provides an oscillation frequency that corresponds to an unused IC. In contrast, the stressed STRO 406 always receives positive and negative voltages from the VDD and GND charge pumps 418/421 during operation of the chip. Four-phase positive and negative charge pumps 418/421 can be used to generate a low ripple VDD and GND supply. The charge pumps 418/421 can be turned-off after the stressing period is over. During the sensing phase, the stressed STRO 406 is operated at nominal VDD and GND to provide degraded oscillations for comparison with the reference STRO 403 oscillations. The counter 412 counts the number of ticks of the reference STRO 403 and stressed STRO 406 with respect to a fixed timer interval. The difference between the counted ticks represents the delay difference between the fresh RO and the degraded RO, which can be equated to the usage interval of the chip. The sensing phase can be initiated in response to a control signal supplied to the chip.

Process variations in the reference and stressed STROs 403/406, which occur during fabrication, can affect the estimate of the age or usage of the chip. An external programmable load can be included and calibrated to compensate for the processing variations between the two STROs. Control signals can also be shared by multiple stages to minimize the control overhead.

Figure 5A:
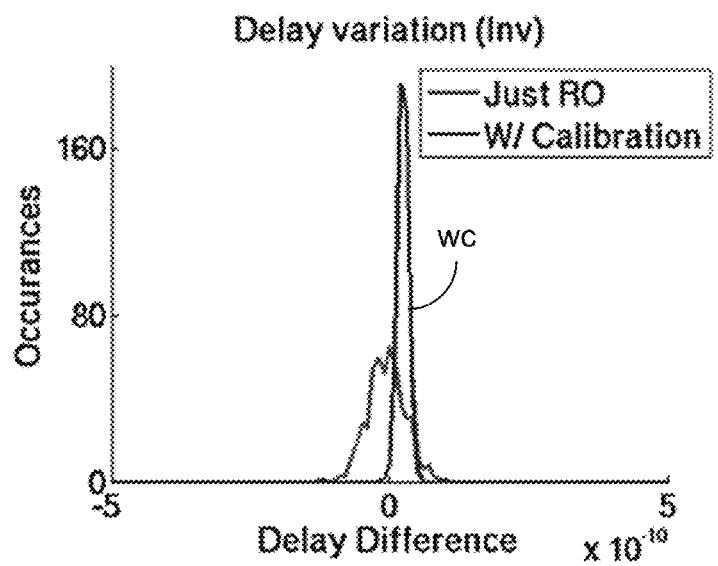
FIGS. 5A and 5B illustrate examples of self-calibration effects on distribution of delay difference in accordance with various embodiments of the present disclosure.
Figure 5B:
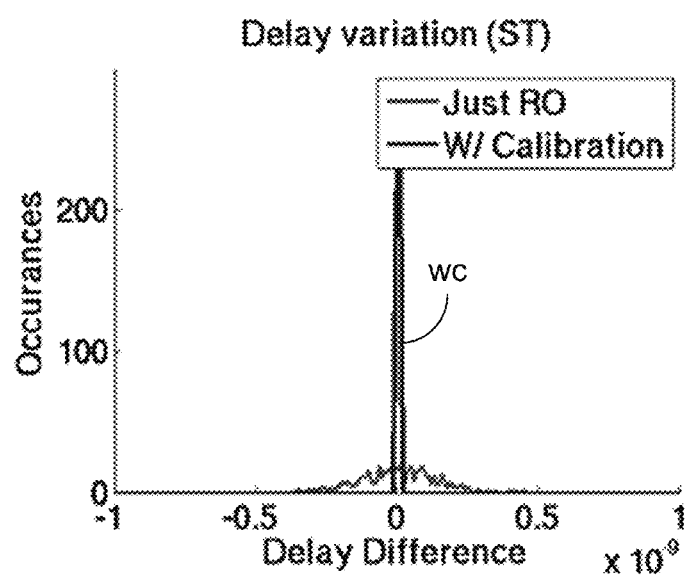

Referring now to FIGS. 5A and 5B, shown are examples of the delay difference distribution of a simulated 31-stage inverter RO and STRO recycling sensors, respectively, before and after calibration. Self-calibration tightens the delay difference distribution minimizing the recycling masking and erroneous detection. A maximum of 4 capacitors were used for the inverter RO and 10 capacitors for the STRO in the simulation. It can be seen from FIGS. 5A and 5B that the distribution tightens significantly with calibration (wc), thereby minimizing both recycling masking and erroneous detection probability.

For analysis, intra-die process variations in 22 nm predictive technology were modeled. The process variation can modelled by lumping the variations in transistor threshold voltage ($V_{th}$). The mean and standard deviation of intra-die $V_{th}$ shift may be assumed to be (0, 50 mV). The actual $V_{th}$ of the transistor is the summation of $V_{th}$ (nominal) and $\Delta V_{th}$ (intra). The simulation temperature was fixed at 298K. For high-$V_{th}$ devices, 300 mV was added on top of the nominal $V_{th}$. For all simulations, the 31-stage RO was employed and a total of 500 Monte Carlo points were simulated to observe the impact of variations. For VDD boosting, simple RO-based 4-phase positive and negative charge pumps were used to generate a low ripple VDD and GND supply. The positive charge pumps provided 1.4V from a 1V of supply voltage and the negative charge pumps provided −0.25V from the 1V of supply voltage. The peak-to-peak ripple was less than 50 mV.

The effectiveness of each design technique was separately evaluated for: (a) the original RO; (b) the RO with calibration, (c) the high-$V_{th}$ RO with calibration; (d) the high-$V_{th}$ RO with calibration and boosting; (e) the original STRO; (f) the STRO with calibration, (g) the high-$V_{th}$ STRO with calibration; and (h) the high-$V_{th}$ STRO with calibration and boosting. Recycling times of 0.1 second (0.1 s), 10 seconds (10 s), 1.5 minutes (1.5 m), 15 minutes (15 m) and 1 day (1 d) were simulated to determine the detection ability. The inverter RO used 4 capacitor loads for calibration whereas the STRO used 10 capacitor loads to nullify wider variation-induced delay distribution. Reliability analysis was performed using MOS reliability analysis (MOSRA) to measure the impact of both HCI and BTI degradations.

Figure 1C:
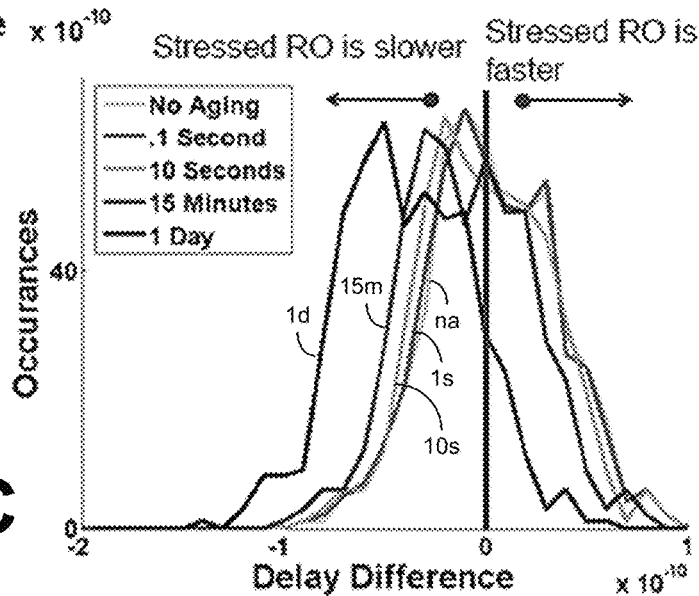
Figure 6A:
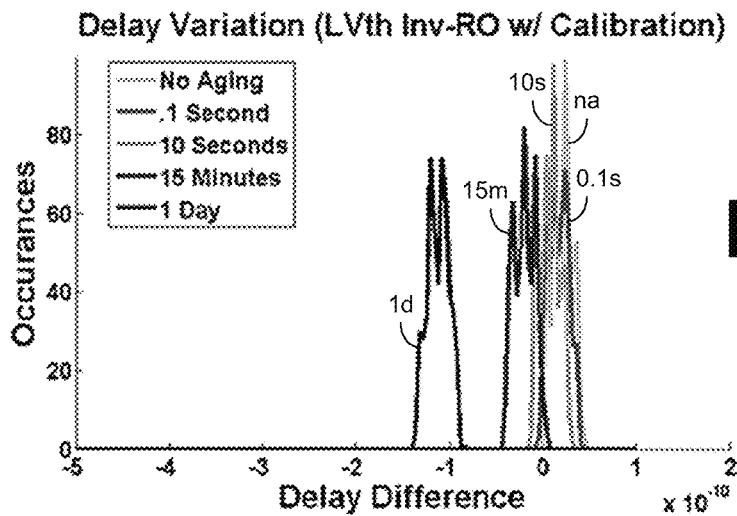
FIGS. 6A through 6C illustrate effects of self-calibration, high threshold voltage devices and/or voltage boosting on distribution of delay difference of an inverter RO based recycling sensor in accordance with various embodiments of the present disclosure.
Figure 6B:
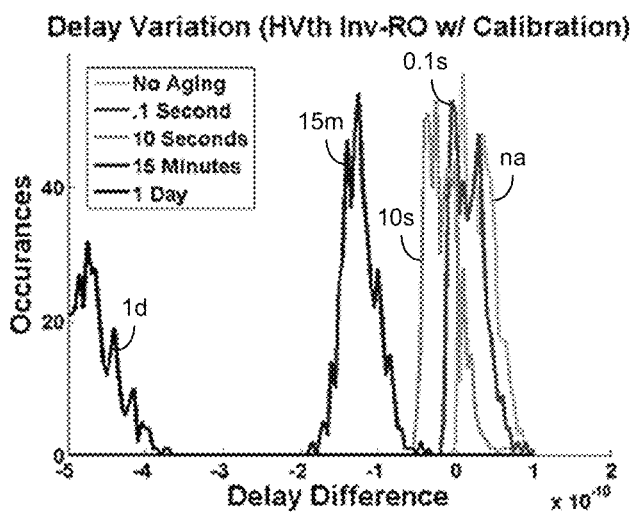
Figure 6C:
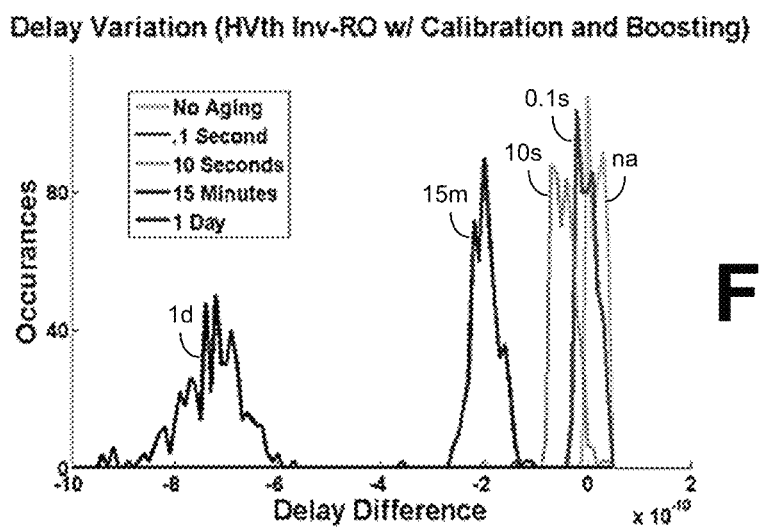

Referring to FIGS. 6A-6C, shown are examples of distributions of delay difference for inverter RO sensor. FIG. 6A illustrates the inverter RO recycling sensor with calibration, FIG. 6B illustrates the inverter RO recycling sensor with high-$V_{th}$ and calibration, and FIG. 6C illustrates the inverter RO recycling sensor with high-$V_{th}$, calibration and boosting. As shown in FIG. 1C, even a day of recycling may not be detected by an inverter RO due to large process-variation induced overlap with original distribution. As illustrated in FIG. 6A, self-calibration enables reliable detection of 1 day of usage and detection of 15 minutes of usage with less than 5% error. Combining high-$V_{th}$ and self-calibration shows detection of 15 minutes of usage with negligible error (less than 1%) and 10 s of usage with about 10% error, as shown in FIG. 6B. As illustrated in FIG. 6C, the addition of VDD boosting and GND under-driving successfully separates the distributions for clear identification of greater than 15 minutes of usage and reduces the error in 10 seconds of usage detection to less than 5%. These results underscore the impact of self-calibration, high-$V_{th}$ and boosting in improving the recycling detection ability by several orders of magnitude.

Figure 7A:
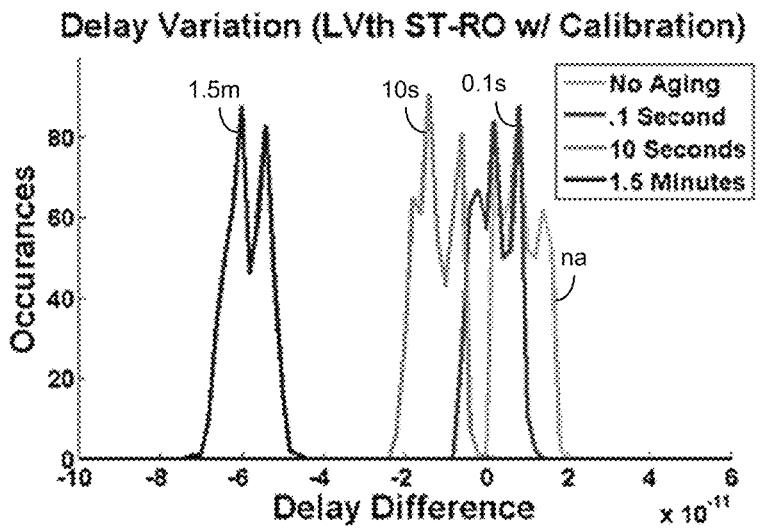
FIGS. 7A through 7C illustrate effects of self-calibration, high threshold voltage devices and/or voltage boosting on distribution of delay difference of a STRO based recycling sensor of FIG. 4 in accordance with various embodiments of the present disclosure.
Figure 7B:
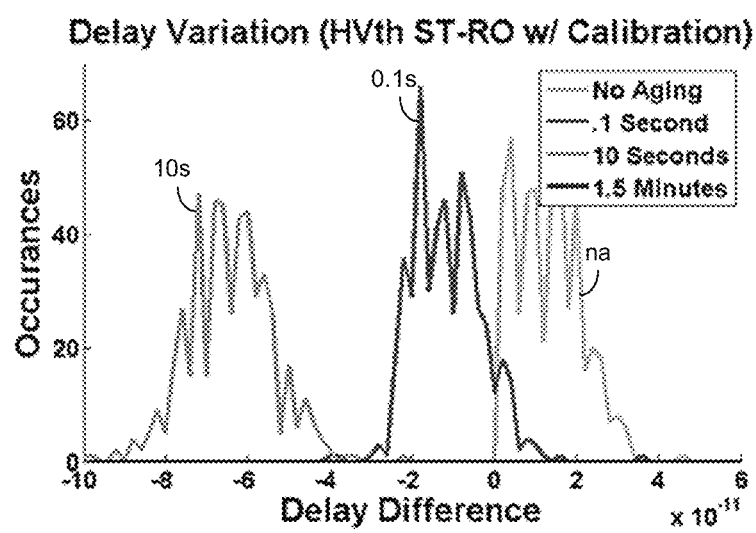
Figure 7C:
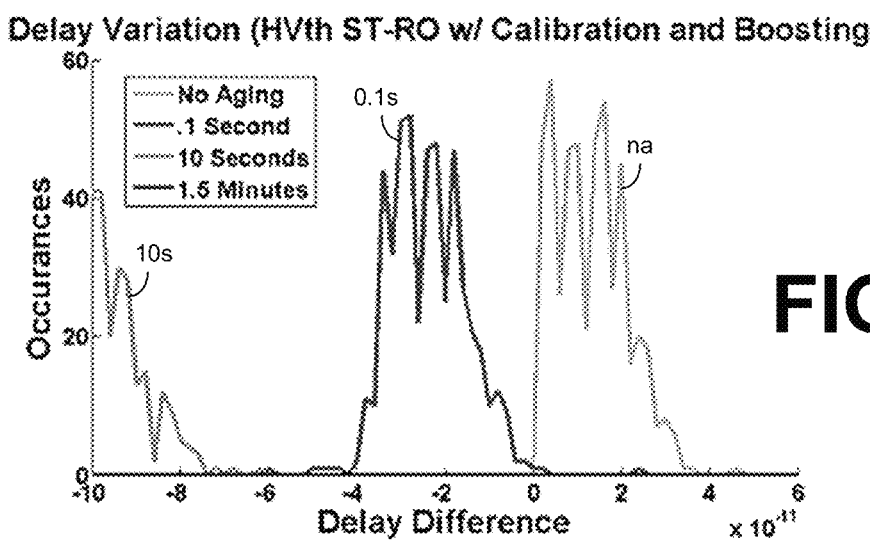
Figure 8A:
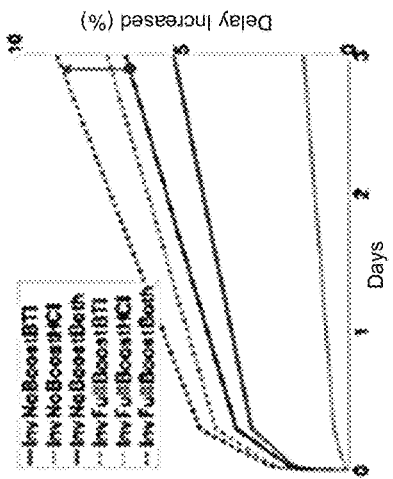
FIGS. 8A through 8F are plots illustrating examples of delay degradation of various implementations of the STRO based recycling sensor of FIG. 4 in accordance with various embodiments of the present disclosure.
Figure 8B:
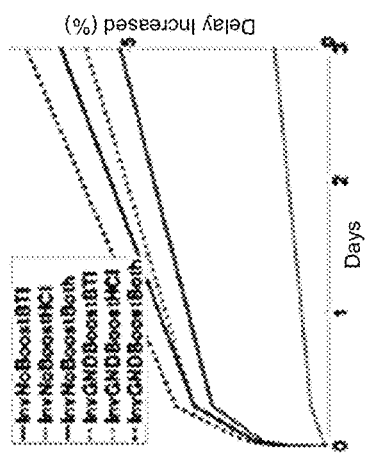
Figure 8C:
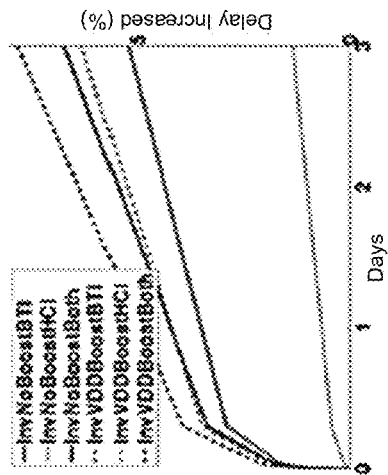
Figure 8D:
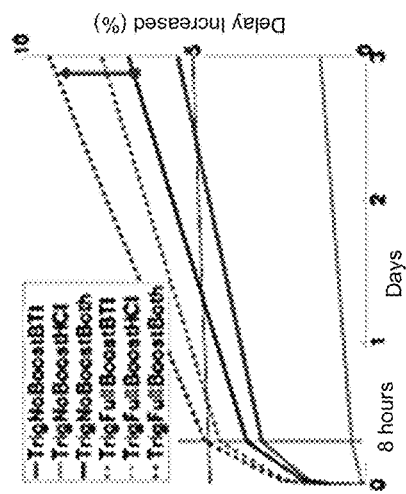
Figure 8E:
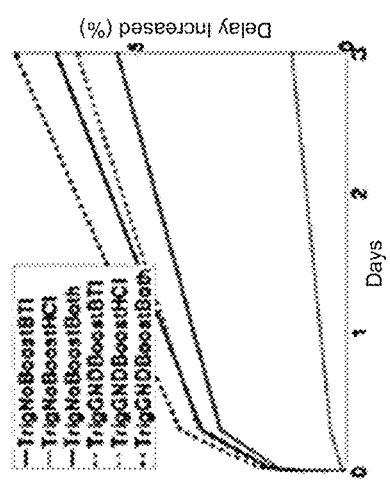
Figure 8F:
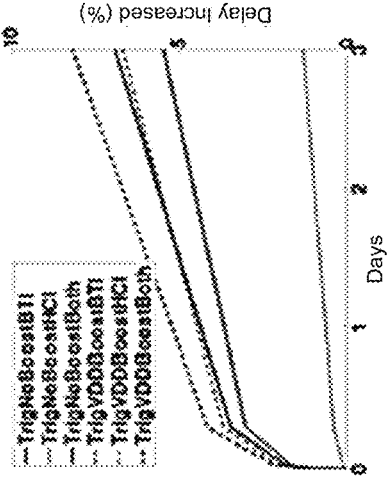

Referring next to FIGS. 7A-7C, shown are examples of distributions of delay difference for inverter STRO sensor. FIG. 7A illustrates the STRO recycling sensor with calibration, FIG. 7B illustrates the STRO recycling sensor with high-$V_{th}$ and calibration, and FIG. 7C illustrates the STRO recycling sensor with high-$V_{th}$, calibration and boosting. From FIG. 7A, self-calibration enables reliable detection of 1.5 minutes of usage. This is 10 times better accuracy than inverter RO with calibration. This may be attributed to the fact that the STRO aging results in a larger delay degradation than the inverter RO. As illustrated in FIG. 7B, combining high-$V_{th}$ and self-calibration shows detection of 10 seconds of usage with negligible error (less than 1%) and 0.1 second of usage with about 10% error. As illustrated in FIG. 6C, the addition of VDD boosting and GND under-driving successfully separates the distributions for clear identification of greater than 10 seconds of usage and reduces the error in 0.1 second of usage detection to less than 1%. This is 10 times more accurate compared to the inverter RO sensor with self-calibration, high-$V_{th}$ and boosting. Considering the original detection accuracy of a day, the STRO recycling sensor was $8.64 \times 10^5$ times more accurate.

The effectiveness of the STRO design was also evaluated with respect to the conventional RO design under a variety of voltage combinations: (a) RO with boosted VDD; (b) RO with under-driven GND; (c) RO with both boosted VDD and under-driven GND; (d) STRO with boosted VDD; (e) STRO with under-driven GND; and, (f) STRO with both boosted VDD and under-driven GND. The operation was verified by simulating the STRO sensor and the conventional RO sensor using the 22 nm predictive technology. The reliability analysis was performed using MOS reliability analysis (MOSRA) and individually measuring the impact of both HCI and BTI degradation on the circuit.

Referring now to FIGS. 8A through 8F, shown are plots illustrating examples of delay degradation for three days of usage of a 15-stage RO with: VDD boosted (FIG. 2A); GND under-driven (FIG. 2B); both GND under-driven and VDD boosted (FIG. 2C); and a 15-stage STRO with: VDD boosted (FIG. 2D); GND under-driven (FIG. 2E); and both GND under-driven and VDD boosted (FIG. 2F). The STRO with boosted VDD and GND shows 8 hours of recycling detection for 5% variation in frequency. Given that RO experiences a 5% variation from nominal frequency due to process variation, the STRO can detect recycled ICs with 8 hours of usage or less. In contrast, a conventional RO with 90 nm technology can only detect usage of more than 1 month. It can be seen from FIGS. 8A-8F that the STRO recycling sensor design outperforms the conventional RO-based sensor by roughly 30%, and is better than both CDR and AF-based sensors.

The STRO recycling sensor may be limited because of area overhead from STs and charge pumps. A ST is 5 times larger than an inverter due to additional transistors and its stacked configuration. The ST can be simplified to reduce the area overhead by eliminating contention in one direction. For example, transistors P1 and P2 of FIG. 3A can be eliminated to create a new ST flavor called STn whereas transistors N0 and N2 can be eliminated to create STp flavor. STn and STp could be alternated to create a low-overhead STRO while achieving similar benefits in terms of delay sensitivity to aging. The resulting STRO would be 2 times larger than the inverter RO. The power overhead due to charge pumps may also be considered. From a security standpoint the STRO recycling sensor has two points of attack: (a) self-calibration setup and, (b) charge pumps. While an invasive attacker may read/modify the fuse bits that store the capacitor programming information for self-calibration, the adversary cannot kill the variation compensation through non-invasive techniques. The adversary may also attack the charge pump through invasive techniques. Since the charge pumps are dedicated to the STRO recycling sensor, it is not possible to create an intentional droop on charge pump through non-invasive techniques. Therefore the proposed sensor is robust to non-invasive attacks.

Isolating the recycled ICs from the genuine ones for arbitrarily small amount of usage (e.g., a few seconds to minutes) is a challenging task. Self-calibration can be used to nullify the effect of process variation, Schmitt Trigger and high threshold voltage devices can be used to enhance the aging-induced delay degradation and voltage boosting can be used to accelerate aging. Simulation results revealed that the STRO recycling sensor can detect recycled ICs with 0.1 second of usage which is $88.64 \times 10^5$ times better than the detection accuracy of conventional recycling sensors.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

At least the following is claimed:

1. A chip, comprising:
   a reference Schmitt trigger ring oscillator (STRO) that enters a sleep mode during operation of the chip;
   a stressed STRO; and
   a VDD charge pump that boosts a positive voltage supplied to the stressed STRO during operation of the chip.

2. The chip of claim 1, wherein the reference STRO and the stressed STRO each comprise an equal number of series connected Schmitt triggers.

3. The chip of claim 1, wherein the reference STRO and the stressed STRO comprise an embedded externally programmable load.

4. The chip of claim 1, further comprising a counter that measures an output frequency of the stressed STRO or an output frequency of the reference STRO.

5. The chip of claim 4, further comprising a multiplexer coupled to an output of the stressed STRO and an output of the reference STRO, where the multiplexer provides the output of the stressed STRO or the output of the reference STRO to the counter.

6. The chip of claim 4, wherein a difference between the output frequency of the reference STRO and the output frequency of the stressed STRO corresponds to an operational time of the chip.

7. The chip of claim 4, wherein nominal voltages are supplied to the stressed STRO and the reference STRO during measurement of the output frequencies.

8. A chip, comprising:
a reference Schmitt trigger ring oscillator (STRO) that enters a sleep mode during operation of the chip;
a stressed STRO; and
a GND charge pump that under-drives a ground voltage supplied to the stressed STRO during operation of the chip.

9. The chip of claim 8, wherein the reference STRO and the stressed STRO each comprise a plurality of series connected Schmitt triggers.

10. The chip of claim 9, wherein the reference STRO and the stressed STRO comprise an embedded externally programmable load.

11. The chip of claim 10, wherein the embedded externally programmable load is connected to internal nodes of the reference STRO and the stressed STRO.

12. The chip of claim 8, further comprising a timer controlling a measurement interval during which a frequency measurement is obtained from an output of the reference STRO or from an output of the stressed STRO.

13. The chip of claim 12, further comprising a multiplexer configured to select the output of the reference STRO or the stressed STRO for the frequency measurement.

14. The chip of claim 12, wherein nominal voltages are supplied to the stressed STRO and the reference STRO during the measurement interval.

15. The chip of claim 12, further comprising a counter that selectively measures an output frequency of the stressed STRO or an output frequency of the reference STRO.

16. The chip of claim 1, comprising a GND charge pump that controls a ground voltage supplied to the stressed STRO.

17. The chip of claim 8, comprising a VDD charge pump that controls a positive voltage supplied to the stressed STRO.

* * * * *